United States Patent
Siddiqui et al.

(10) Patent No.: US 10,510,402 B2
(45) Date of Patent: Dec. 17, 2019

(54) MITIGATING WRITE DISTURBANCE IN DUAL PORT 8T SRAM

(71) Applicant: Synopsys, Inc., Mountain View, CA (US)

(72) Inventors: M. Sultan M. Siddiqui, Noida (IN); Sumit Srivastav, Benares (IN); Dattatray Ramrao Wanjul, Nashik (IN); Manankumar Suthar, Ahmedabad (IN); Sudhir Kumar, Shastri Nagar (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/171,246

(22) Filed: Oct. 25, 2018

(65) Prior Publication Data
US 2019/0130965 A1 May 2, 2019

(30) Foreign Application Priority Data
Oct. 26, 2017 (IN) .............................. 201741037918

(51) Int. Cl.
| | | |
|---|---|---|
| *G11C 11/12* | (2006.01) | |
| *G11C 11/419* | (2006.01) | |
| *G11C 11/418* | (2006.01) | |
| G11C 8/16 | (2006.01) | |
| G11C 11/412 | (2006.01) | |

(52) U.S. Cl.
CPC .......... *G11C 11/419* (2013.01); *G11C 11/418* (2013.01); *G11C 8/16* (2013.01); *G11C 11/412* (2013.01); *G11C 2207/002* (2013.01); *G11C 2207/005* (2013.01)

(58) Field of Classification Search
CPC .................................................... G11C 11/412
USPC ........................................ 365/189.04, 230.05
See application file for complete search history.

(56) References Cited

U.S. PATENT DOCUMENTS

2008/0137440 A1* 6/2008 Liaw .................... G11C 11/412
365/189.04

OTHER PUBLICATIONS

Ishii et al., "A 28-nm dual-port SRAM macro with active bitline equalizing circuitry against write disturb issue," In VLSI Circuits (VLSIC), 2010 IEEE Symposium on, pp. 99-100. IEEE, 2010.
Nii et al., "Synchronous ultra-high-density 2RW dual-port 8T-SRAM with circumvention of simultaneous common-row-access," IEEE Journal of Solid-State Circuits 44, No. 3 (2009): 977-986.
Wu et al., "A 45-nm dual-port SRAM utilizing write-assist cells against simultaneous access disturbances," IEEE Transactions on Circuits and Systems II: Express Briefs 59, No. 11 (2012): 790-794.

* cited by examiner

*Primary Examiner* — Jason Lappas
(74) *Attorney, Agent, or Firm* — Haynes Beffel & Wolfeld LLP

(57) ABSTRACT

The independent claims of this patent signify a concise description of embodiments. Disclosed is technology for reducing write disturbance while writing data into a first SRAM cell and accessing a second SRAM cell in a row of SRAM cells. This Abstract is not intended to limit the scope of the claims.

24 Claims, 13 Drawing Sheets

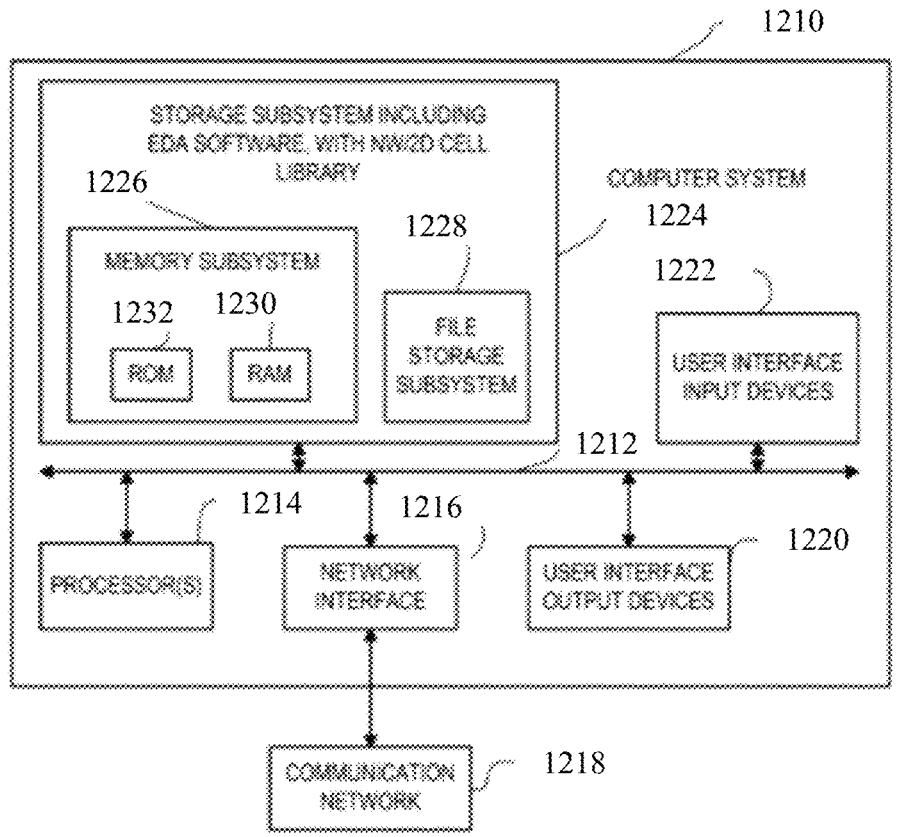
FIG. 12A
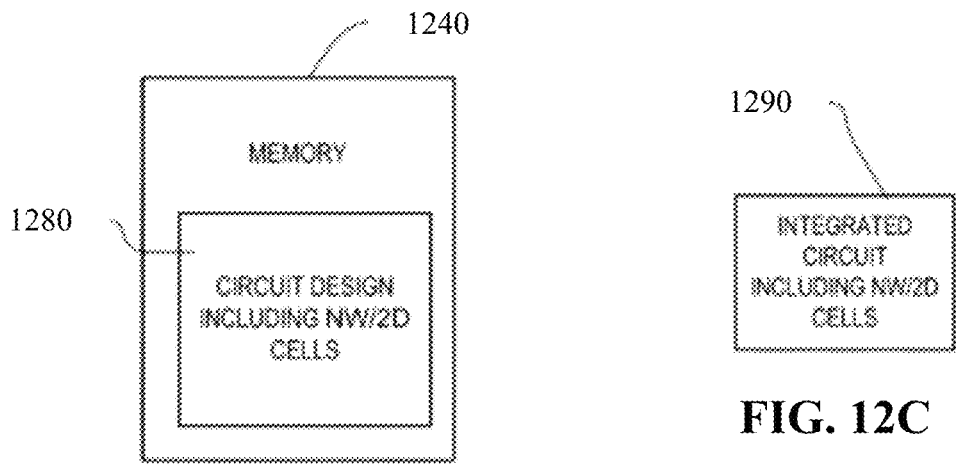
FIG. 12B
FIG. 12C

MITIGATING WRITE DISTURBANCE IN DUAL PORT 8T SRAM

CROSS-REFERENCE TO RELATED APPLICATIONS

This application claims priority under 35 U.S.C. § 119(e) to the Indian Provisional Patent Application No.: 201741037918, filed on 26 Oct. 2017, the entire contents of which are hereby incorporated by reference herein.

FIELD OF THE INVENTION

The invention relates to static random access memory (SRAM), and more particularly to an SRAM array and related technologies.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

BACKGROUND

Embedded single port and dual port static random access memories (SRAMs) are the key components in contemporary memory-rich Systems on a Chip (SoCs). In deep submicron technologies, read and write margins of these embedded SRAMs are degraded due to increased variations at low voltage conditions. Embedded dual port SRAMs are widely used as buffer memories in multimedia and graphical processing chips, and data caches in multi-core processors. Dual port SRAMs suffer from an extended write time when one of the ports of the SRAM array is used to perform a write operation in an SRAM cell while the second port is used to access another SRAM cell in the same row (i.e., same row addresses) or the same SRAM cell.

The extended write time can be mitigated by an active bit line equalizing circuitry (as described in Y. Ishii et al., "A 28-nm dual port SRAM macro with active bit line equalizing circuitry against write disturb issue," in Symp. VLSI Circuits 2010 Dig. Tech. Papers, June 2010, pp. 99-100), a write-assist 8T cell (described in J. J. Wu et al., "A 45-nm Dual-port SRAM Utilizing Write-Assist cells against simultaneous access disturbances," TCAS II, November 2012, pp. 790-994), or employing a priority row decoder and a shifted bit line access scheme (described in K. Nii et al., "Synchronous ultra-high-density 2RW dual-port-8T-SRAM with circumvention of simultaneous common-row-access," IEEE J. Solid-State Circuits, vol. 44, no. 3, pp. 977-986, March 2009). All the above papers are incorporated into this application by reference. The circuit designs in Y. Ishii et al., J. J. Wu et al. and K. Nii et al. require double the hardware for the write driver circuitry and two separate "same row" address decoders for port A and port B. The circuit design with the write-assist 8T cell in J. J. Wu et al. only assist single-sided write '0' in inter-port writing, and limits its influence to suppress the extended write time. While the circuit designs in Y. Ishii et al., J. J. Wu et al. support synchronous and asynchronous dual port SRAM operations, only synchronous dual port SRAM operations are possible with the circuit design in K. Nii et al.

It is therefore desirable to provide an SRAM device that supports both synchronous and asynchronous dual port SRAM operations and mitigates extended write time issues in dual port SRAMs.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

Roughly described, a static random access memory (SRAM) device comprising a plurality of dual-port SRAM cells is provided. The dual-port SRAM cells are arranged in rows that share word lines, and columns that share bit lines. As used herein, the terms "row" and "column" are defined by the lines that they share, rather than by physical geometry. Each SRAM cell comprises a pair of cross-coupled inverters having a first data port coupled to a first word line, a first bit line, and a first bit-complement line, and further has a second data port coupled to a second word line, a second bit line, and a second bit-complement line. The first bit line is connected to a first data terminal through a first data transmission switch responsive to a first port write signal, and to a second data terminal through, in series, a second data transmission switch responsive to a second port write signal and a first cross-connect switch responsive to a write disturb enable signal. The second bit line is connected to the second data terminal through a third data transmission switch responsive to the second port write signal, and to the first data terminal through, in series, a fourth data transmission switch responsive to the first port write signal and a second cross-connect switch responsive to the write disturb enable signal. The first bit-complement line is connected to a first data-complement terminal through a fifth data transmission switch responsive to the first port write signal, and to a second data-complement terminal through, in series, a sixth data transmission switch responsive to the second port write signal and a third cross-connect switch responsive to the write disturb enable signal; and the second bit-complement line is connected to the second data-complement terminal through a seventh data transmission switch responsive to the second port write signal, and to the first data-complement terminal through, in series, an eighth data transmission switch responsive to the first port write signal and a fourth cross-connect switch responsive to the write disturb enable signal.

The data transmission switches and the cross-connect switches can be N-channel transistors, P-channel transistors or transmission gates. In some embodiments, the first cross-connect switches, the second cross-connect switches, the third cross-connect switches and the fourth cross-connect switches in a row of SRAM cells are responsive to a common write disturb enable signal.

Circuitry for an array of dual-port SRAM cells is provided to mitigate extended write time issues in dual port SRAMs by duplicating inter-port write data during dual port access during synchronous and asynchronous dual port SRAM operations. The circuitry preferably employs N-channel transistors as switches, thereby minimizing the increase in the area of the write driver circuitry. Alternatively, the circuitry can employ P-channel transistors as switches.

A method is provided that may be used for reducing write disturbances while writing data in a first dual-port SRAM cell in a row of SRAM cells described above. The method comprises applying a high voltage to the first word line connected to the first SRAM cell, loading data to be written in the first SRAM cell in the first data terminal, applying a first port write signal to the first data transmission switch, the fourth data transmission switch, the fifth data transmission switch and the eighth data transmission switch of the first SRAM cell, and applying a write disturb enable signal to the first cross-connect switch, the second cross-connect switch, the third cross-connect switch and the fourth cross-connect switch of the first SRAM cell.

Another method is provided that may be used for reducing write disturbance while writing data in a first SRAM cell and accessing a second SRAM cell in a row of SRAM cells. An SRAM cell can be accessed to read data stored in the cell or to write data in the cell. The first data ports of the first and second SRAM cells are coupled to a common first word line shared by SRAM cells in the row of SRAM cells and the second data ports are coupled to a common second word line shared by SRAM cells in the row of SRAM cells. The method comprises: applying a high voltage to the common first word line; applying a high voltage to the common second word line; loading data to be written in the first SRAM cell in the first data terminal; applying a first port write signal to the first data transmission switch, the fourth data transmission switch, the fifth data transmission switch and the eighth data transmission switch of the first SRAM cell; and applying a common write disturb enable signal to the first cross-connect switch, the second cross-connect switch, the third cross-connect switch and the fourth cross-connect switch of the first SRAM cell and first cross-connect switch, the second cross-connect switch, the third cross-connect switch and the fourth cross-connect switch of the second SRAM cell. In some embodiments, the common write disturb enable signal is generated by a row address comparator on dependence upon row addresses of the first SRAM cell and the second SRAM cell.

One or more embodiments of the invention or elements thereof can be implemented in the form of a computer product including a non-transitory computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The invention will be described with respect to specific embodiments thereof, and reference will be made to the drawings.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 12A, 12B, and 12C depict simplified block diagrams of a computer system suitable for use with embodiments of the technology, as well as circuit design and circuit embodiments of the technology.

In such various figures, reference signs may be omitted as is consistent with accepted engineering practice; however, one of ordinary skill in the art will understand that the illustrated components are readily understood when viewed in the context of the illustration as a whole and the accompanying disclosure describing such various figures.

DETAILED DESCRIPTION

The following Detailed Description, Figures and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Figure 1:
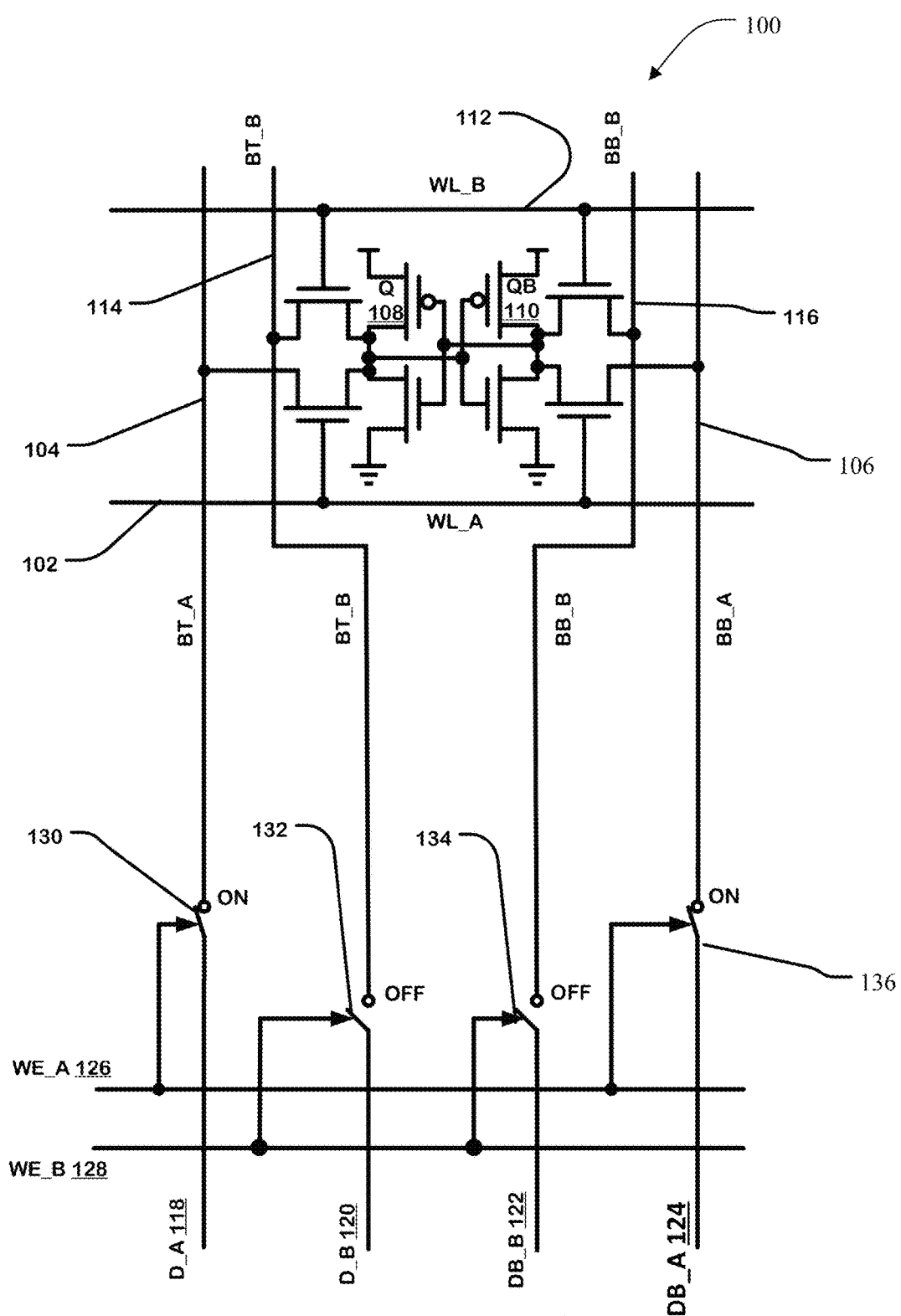
FIG. 1 illustrates an 8T dual port SRAM cell.

FIG. 1 illustrates an 8T dual port SRAM cell 100. The SRAM cell 100 has two internal storage nodes Q 108 and QB 110 formed by two cross-coupled CMOS inverters. Node Q 108 is both the output of the first inverter and the input of the second inverter, while node QB 110 is both the output of the second inverter and the input of the first inverter. The SRAM cell 100 comprises two port A pass gates that are both controlled by word line A 102 (WL_A). The port A pass gates are connected to the bit line 104 for port A(BT_A), the bit-complement line 106 for port B(BB_A) and the internal storage nodes Q 108 and QB 110 of the SRAM cell. The SRAM cell 100 further comprises two port B pass gates that are both driven by word line B 112 (WL_B). The port B pass gates are connected to the bit line 114 (BT_B) and the bit-complement line 116 (BB_B) of port B and to the internal storage nodes Q 108 and QB 110. Both port A and B are independently available for reading and writing.

The bit line for port A 104 (BT_A) is connected to a first data terminal 118 (D_A) through a first transmission switch 130. The first transmission switch can be turned "on" when a first port write signal 126 (WE_A) is applied to the switch. The bit line for port B 114 (BT_B) is connected to the second data terminal 120 (D_B 120) through a data transmission switch 132 responsive to a second port write signal 126 (WE_B). The bit-complement line for port A 106 (BB_A) is connected to a first data-complement terminal 124 (DB_A) through a data transmission switch 136 responsive to the first port write signal 126 (WE_A). The bit-complement line for port B 116 (BB_B) is connected to a second data-complement terminal 122 (DB_B) through a data transmission switch 134 responsive to the second port write signal 128 (WE_B). Note that while the "terminals" are shown in some of the drawings herein as being located at edges of a cell or array of cells, it will be appreciated that many cells and many arrays of cells may be located on a single integrated circuit chip. Thus the term "terminal", as used herein, refers to a terminal node of an array, or a portion of an array, and need not refer to a terminal node of an integrated circuit chip.

During read operations, the precharged bit lines are discharged through the internal storage nodes to replicate the data in the SRAM cell onto the bit lines. During write operations, data to be written to the SRAM cell 100 are loaded onto the bit lines of one of the ports through the data terminals. The data loaded onto the bit lines forces the storage nodes to be updated with the applied data. In a dual port SRAM cell, port A can be used to write data in the SRAM cell while port B is used to read data from the same SRAM cell.

In order to perform a write operation through port A, data is loaded onto the bit line 104 (BT_A) through the data terminal 118 (D_A) and a high voltage is applied to word line A 102 (WL_A), and a first port write signal 126 (WE_A) is applied to the data transmission switch 130. The bitwise complement of the data is loaded onto the bit-complement line 106 (BB_A) through the data-complement terminal 124 (DB_A). Though the precise timing by which these signals and values are applied may differ depending on the embodiment, they do at least overlap in time. In some embodiment, port B of the SRAM cell 100 may be either in a read or pseudo read operation. As described herein, a "high" voltage is nominally the positive power supply voltage dependent on the technology node with a typical accepted tolerance. For 14 nm/16 nm FinFET, the positive power supply may be 1V with a typical accepted tolerance of +/−20%. A "low" voltage may be nominally equal to the negative power supply voltage, which typically is ground voltage.

Contemporary SRAM architectures can employ a column multiplexed system or bit-interleaving to avoid multi-bit errors. For instance, a column multiplexed 2 (CMUX=2) architecture allows two different columns (Columns 0 and 1) to share the same row with common word line for SRAM array as illustrated in FIGS. 2A, 2B, 2C and 2D. An SRAM cell can be not selected, selected or half-selected. A selected SRAM cell in the SRAM array is the actual addressed cell (row and column address) with selected row and selected column. A half-selected SRAM cell in the SRAM array is one which is selected by virtue of sharing the same row, i.e. selected row with the common word line and unselected column. Unselected SRAM cells in the SRAM array are ones which are not addressed by either the row or column address.

FIGS. 2A, 2B, 2C and 2D portray four dual port SRAM cells in a column multiplexed or bit-interleaving SRAM architecture (CMUX=2). For clarity, a 2×2 dual port SRAM array with two rows (Row 0 and 1) and two columns (Column 0 and 1) is shown. Each dual port SRAM cell is shown as a rectangle box divided into two halves with ports A and B. For the SRAM cells in row 0, the word line for ports A is WL_A0 and the word line for ports B is WL_B0.

For the SRAM cells in row 1, the word line for ports A is WL_A1 while the word line for ports B is WL_B1. For the SRAM cells in column 0, the bit lines and bit-complement lines for ports A are BT_A0 and BB_A0 respectively, and the bit lines and bit-complement lines for ports B are BT_B0 and BB_B0 respectively. For the SRAM cells in column 1, the bit lines and bit-complement lines for ports A are BT_A1 and BB_A1 respectively, and the bit lines and bit-complement lines for ports B are BT_B1 and BB_B1 respectively. Selected SRAM cells with a selected port, either A or B, are shown as dotted black color boxes. Unselected and half-accessed SRAM cells are shown as solid black color boxes.

Figure 2A:
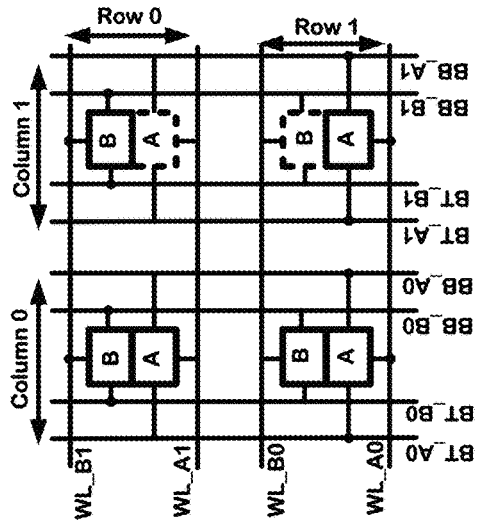
FIG. 2 (FIGS. 2A, 2B, 2C and 2D collectively) illustrate example scenarios where dual port SRAM cells are accessed in an SRAM array through both ports.
Figure 2B:
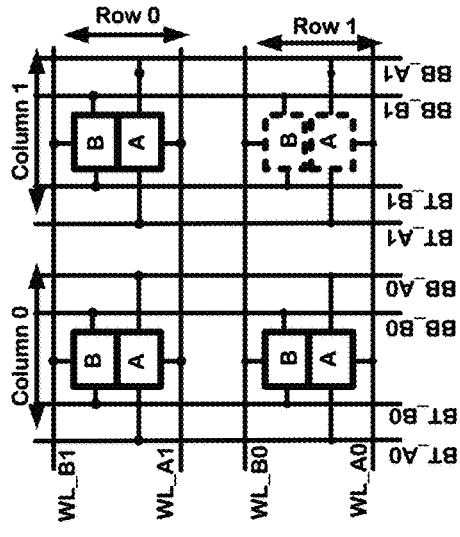
Figure 2C:
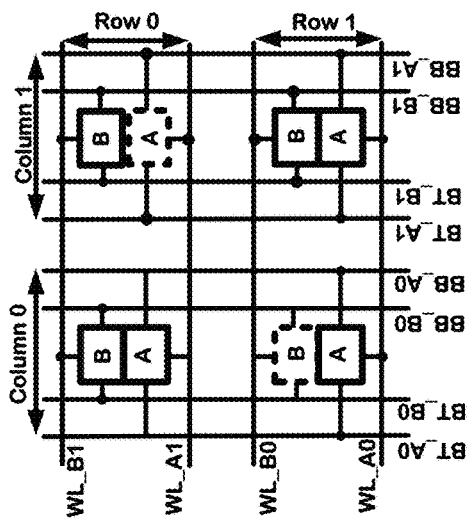
Figure 2D:
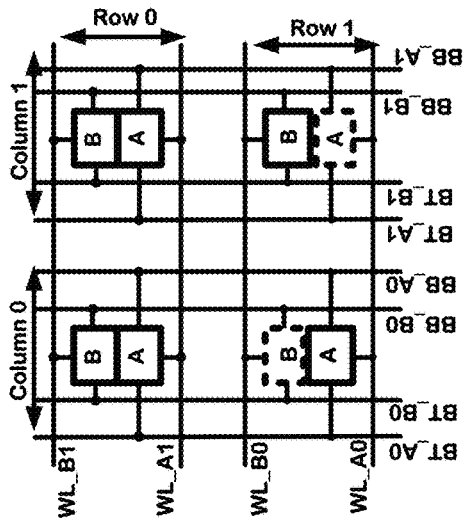

FIG. 2A depicts a scenario where a different row address and a different column address for port A and B are accessed. FIG. 2B depicts a scenario in which a different row but same column addresses for port A and B are accessed. In both of the examples in FIGS. 2A and 2B, only a single port of the dual port SRAM cell is accessed. Simultaneous writing, reading, or reading and writing for both ports are possible. Accessing a single SRAM cell in a row does not pose any access conflict in the selected dual port SRAM cell. FIG. 2C represents an access scenario in which the same row but different column addresses for port A and B are accessed. FIG. 2D illustrated an access scenario in which the same row and the same column addresses for port A and B are accessed. In the examples illustrated in FIGS. 2C and 2D, an access conflict would arise if complementary write data is to be written to the dual port SRAM cells through port A and B simultaneously. Writing the same data to the dual port SRAM cell through port A and B simultaneously does not pose any access conflict. Still, the simultaneous reading or reading/writing from both ports are possible.

Figures 3A, 3B:
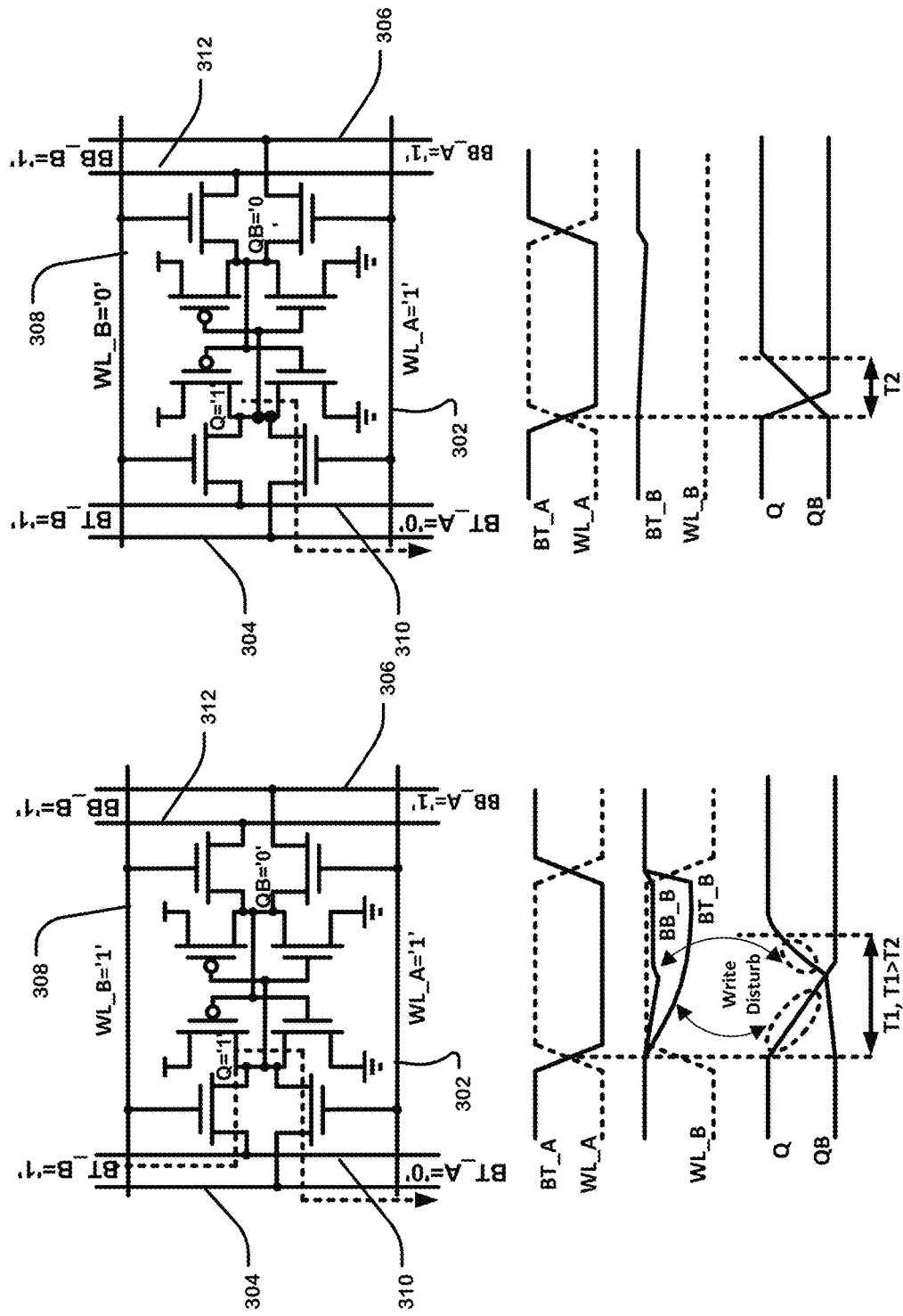
FIG. 3 (FIGS. 3A and 3B collectively) illustrates extended write time in a dual-port SRAM cell.

Accessing two SRAMs in a row of dual port SRAM cells or accessing the same cell through both the ports, hereby known as a "dual port access," may cause a worst case write, pseudo read and worst case read conditions. Worst read and pseudo read affects the cell's stability in the accessed dual port SRAM cell, and in the worst case write demands increased word line pulse width for a successful write operation. FIG. 3A depicts a dual port access in a dual port SRAM cell with a write operation in port A (with a word line A 302 WL_A, a bit line 304 BT_A and a bit-complement line 306 BB_A) and a read/pseudo read operation in port B (with a word line B 308 WL_B, a bit line 310 BT_B and a bit-complement line 312 BB_B). A synchronous firing of the word line A 302 WL_A and the word line B 308 WL_B for both the ports causes an extended write time T1. The write operation through port A cannot immediately discharge the Q storage node to ground level because of the disturbance from the port B bit line 310 BT_B. Also, the rising of the QB node to VDD level is also hampered by the disturbance from the port B bit-complement line 312 BB_B. These collective disturbances in the write operations extend the write time (T1) in dual port SRAM cell. FIG. 3B shows a single port access in a dual port SRAM cell with a write operation through port A (with a word line A 302 WL_A, a bit line 304 BT_A and a bit-complement line 306 BB_A) and no operation in port B (with a word line B 308 WL_B, a bit line 310 BT_B and a bit-complement line 312 BB_B). In the example in FIG. 3B, the write operation through port A immediately discharges the Q storage node to ground level as there is no disturbance from the port B. The write operation finishes in write time T2 which is shorter when compared to the write time T1 during the dual port access in FIG. 3A.

Figure 4:
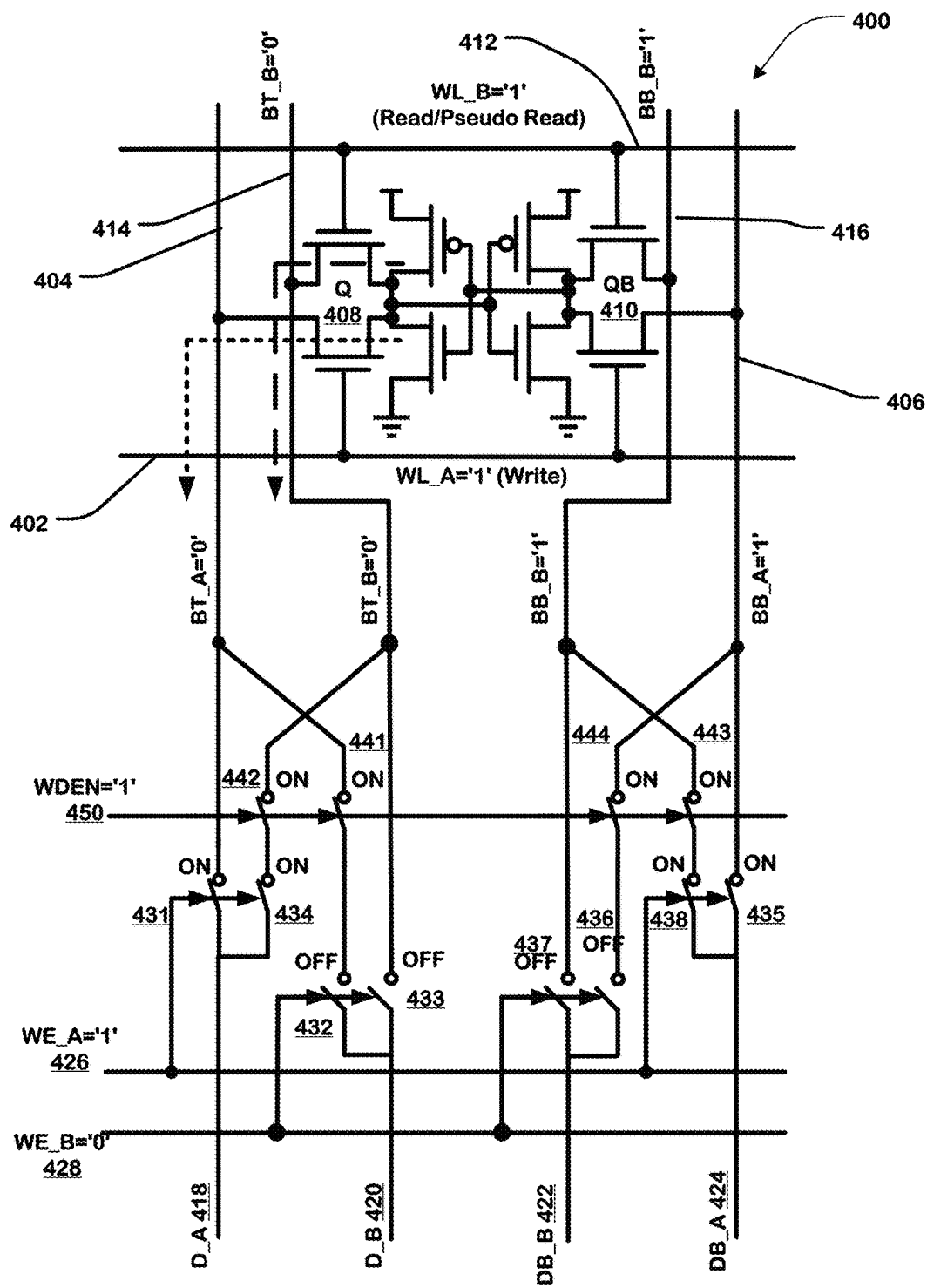
FIG. 4 illustrates an 8T dual port SRAM cell with circuitry for duplicating inter-port write data as described herein.

FIG. 4 illustrates an 8T dual port SRAM cell 400 with circuitry for reducing write disturbances during a dual port access. The SRAM cell 400 comprises port A pass gates that are controlled by word line A 402 (WL_A). The port A pass gates are connected to the bit line 404 for port A(BT_A), the bit-complement line 406 for port B(BB_A) and the internal storage nodes Q 408 and QB 410 of the SRAM cell. The internal storage nodes are formed by two cross-coupled inverters. The SRAM cell 400 further comprises a port B pass gates that are driven by word line B 412 (WL_B). The port B pass gates are connected to the bit line 414 (BT_B) and the bit-complement line 416 (BB_B) of the port B to the internal storage nodes Q 408 and QB 410. Both port A and B are independently available for reading and writing.

The first bit line for port A 404 (BT_A) is connected to a first data terminal 418 (D_A) through a first data transmission switch 431 responsive to a first port write signal 126 (WE_A). As used herein, a "switch" is an electrical component that can interrupt data flow from in a conducting path (e.g., bit lines). A switch can remove or restore the conducting path in a circuit in response to an applied signal. For example, data is allowed to flow in the bit line 404 (BT_A) from or to the data terminal 418 (D_A) when the first port write signal 126 (WE_A) is asserted. If the first port write signal 126 (WE_A) is not asserted, data is not allowed to flow in the bit line 404 (BT_A). The first bit line for port A 404 (BT_A) is also connected to a second data terminal 420 (D_B) through a second data transmission switch 422 responsive to a second port write signal 428 (WE_B) and a first cross-connect switch 441 responsive to a write disturb enable signal 450 (WDEN). The second data transmission switch 422 and the first cross-connect switch 441 are series-connected, meaning both have to be enabled in order for data to flow from the second data terminal 420 to the first bit line for port A 404.

The second bit line 414 (BT_B) is connected to the second data terminal 420 (D_B) through a third data transmission switch 433 responsive to the second port write signal 428 (WE_B), and to the first data terminal 418 (D_A) through, in series, a fourth data transmission switch 434 responsive to the first port write signal 426 (WE_A) and a second cross-connect switch 442 responsive to the write disturb enable signal 450 (WDEN).

The first bit-complement line for port A 406 (BB_A) is connected to a first data-complement terminal 424 (DB_A) through a fifth data transmission switch 435 responsive to the first port write signal 426 (WE_A). The first bit-complement line for port A 406 (BB_A) is also connected to a second data-complement terminal 422 (DB_B) through, in series, a sixth data transmission switch 426 responsive to the second port write signal 428 (WE_B) and a third cross-connect switch 443 responsive to the write disturb enable signal 450 (WDEN).

The second bit-complement line 416 (BB_B) is connected to the second data-complement terminal 422 (DB_B) through a seventh data transmission switch 437 responsive to the second port write signal 428 (WE_B), and to the first data-complement terminal 424 (DB_A) through, in series, an eighth data transmission switch 438 responsive to the first port write signal 426 (WE_A) and a fourth cross-connect switch 444 responsive to the write disturb enable signal 450 (WDEN).

The circuitry in FIG. 4 duplicates the data from port A to port B by two additional series-connected switches which are ON (i.e. enable data to pass) when one or both ports undergo a write operation during a dual port access scenario. One switch is controlled by a write enable signal (WE_A/ WE_B), and the other switch is controlled by write disturb enable (WDEN) signal which is asserted when the control circuitry detects that two ports in a row of SRAM cells are accessed at the same time. In order to perform a write operation through port A, data is loaded in the first bit line 404 (BT_A) through the first data terminal 118 (D_A) and a high voltage is applied to first word line 402 (WL_A) and a first port write signal 426 (WE_A) is applied to the first data transmission switch 431, the fourth data transmission switch 434, the fifth data transmission switch 435 and the eight data transmission switch 438. If another port in the same row is accessed, a write disturb enable signal 450 (WDEN) is applied to the first cross-connect switch 441, the second cross-connect switch 442, the third cross-connect switch 443 and the fourth cross-connect switch 444. Applying the data write disturb enable signal 450 (WDEN) causes data from port A to be duplicated in port B. The complement of the data is loaded in the first bit-complement line 406 (BB_A) through the first data-complement terminal 424 (DB_A) and duplicated in the second bit-complement line 416 (BB_B).

Due to duplication of inter-port write data, the Q storage node 408 starts discharging through the second bit line 414 (BT_B). There is one discharging path going through the first bit line 404 (BT_A) and another discharging path going through the second bit line 414 (BT_B). As there are two paths to discharge, write disturbance is mitigated and consequently, the write time is improved during dual port access scenarios.

Figure 5:
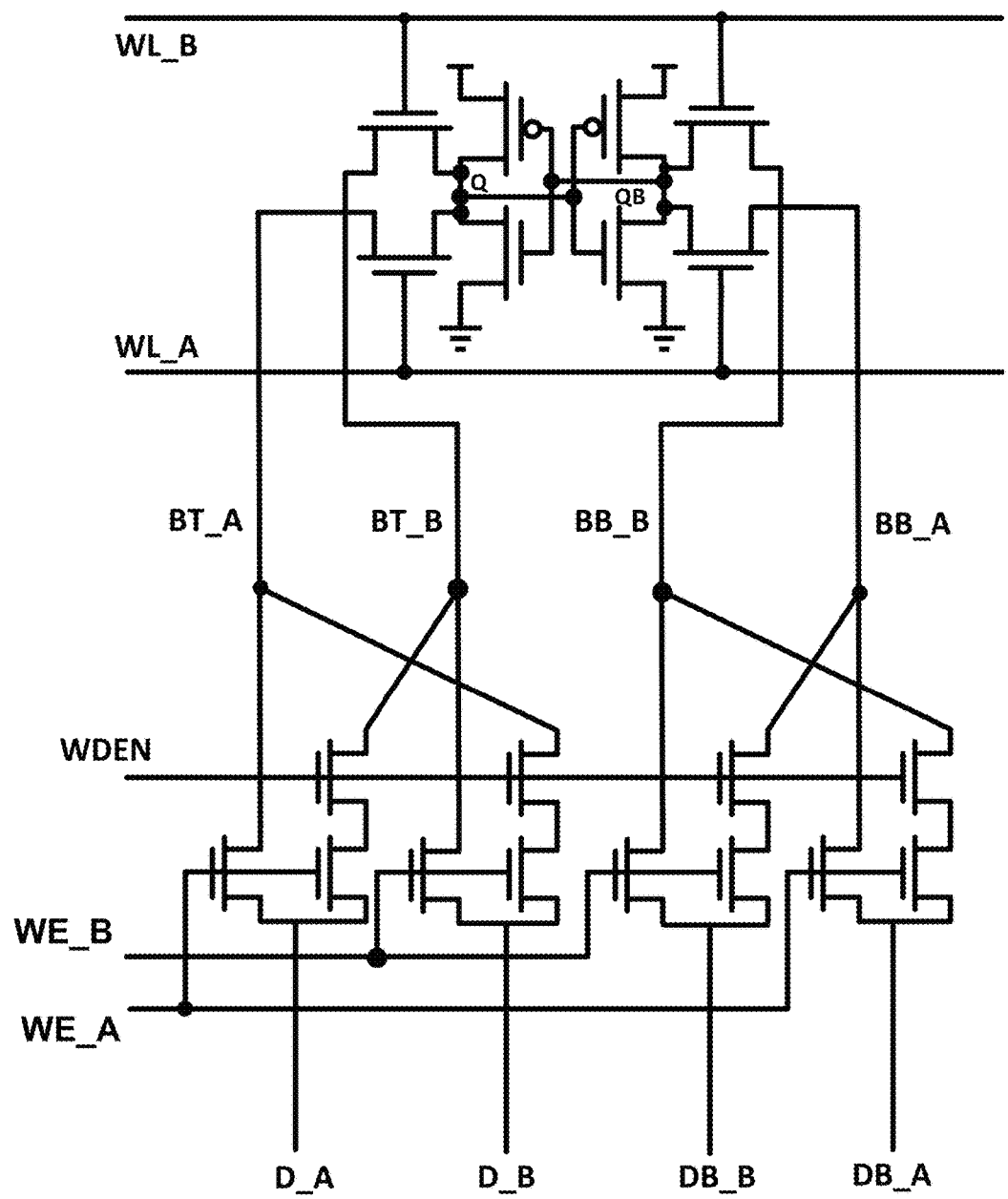
FIG. 5 illustrates an 8T dual port SRAM cell with N-channel transistors as data transmission switches and cross-connect switches.

FIG. 5 illustrates an 8T dual port SRAM cell where N-channel transistors are used as the data transmission switches and cross-connect switches. The gates of the data transmission switches are connected to receive the first write port signal WE_A or the second write port signal WE_B. When the write port signals are asserted, data is allowed to flow from the data terminals to the bit lines. The gates of the cross-connect switches are connected to receive the write disturb enable signal WDEN. When the write disturb enable signal is asserted, data can be duplicated from port A to port B or vice versa. In some embodiments, P-channel transistors can be used as the data transmission switches and the cross-connect switches. In other embodiments, transmission gates can be used as the data transmission switches and the cross-connect switches. As the reader is aware, a transistor has three terminals: a gate, a source terminal and a drain terminal. As used herein, the source and drain terminals of a transistor are sometimes referred to collectively as "current path terminals". Current flows through the transistor from one of the current path terminals to the other, with the gate terminal controlling the flow. Thus when a transistor is said herein to operate in response to a specified signal, this means that the specified signal is applied to the gate of the transistor. In addition, when two transistors are said to be connected "in series", this means that their current path terminals are connected in series.

Figure 6:
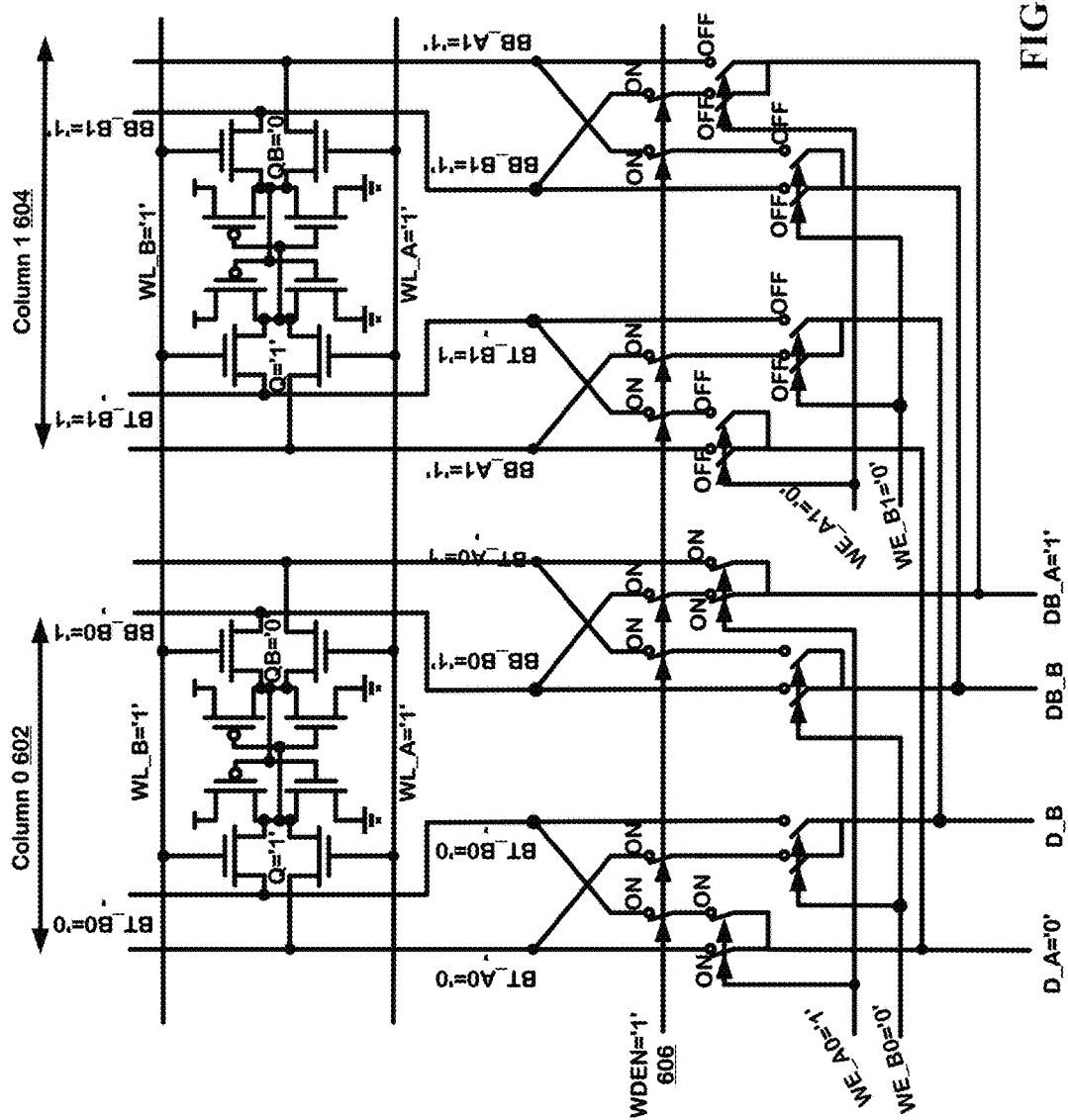
FIG. 6 illustrates a row of 8T dual port SRAM cells with circuitry for duplicating inter-port write data as described herein.

FIG. 6 depicts the dual port SRAM architecture with CMUX=2. in the scenario in which the same row address is accessed for ports A and B. Port A is undergoing a write operation with selected Column 0 address 602 and port B is undergoing a read operation with selected Column 1 address 604. For clarity, read enable switches connecting the bit lines to the sense amplifiers for the read operation are not shown. As two ports are being accessed in the row, a common write disturb enable signal WDEN 606 is asserted.

Figure 7:
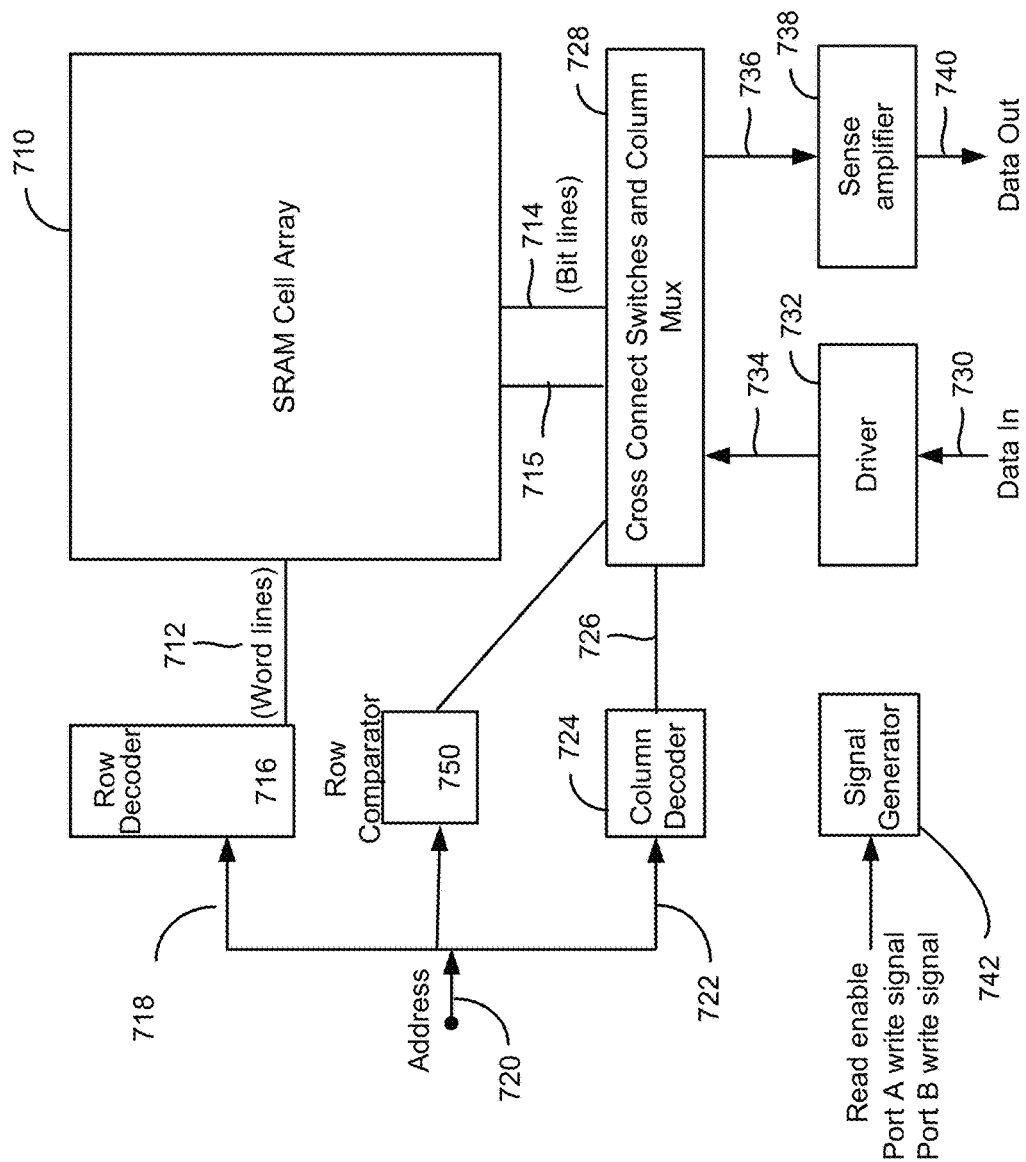
FIG. 7 is a block diagram of a typical 8T dual port SRAM array and decoder/driver circuitry, which may be a stand-alone SRAM device or part of a larger integrated circuit device and which may incorporate aspects of the invention.

FIG. 7 is a block diagram of an SRAM array and decoder/driver circuitry, which may be a standalone SRAM device or part of a larger integrated circuit device. It comprises an SRAM array 710, having word lines 712 and bit lines 714. The word lines 712 are connected to outputs of a row decoder 716, which receives a subset 718 of bits of the address input 720. The remainder 722 of the bits of the address input 720 are connected to a column decoder 724, which provides select lines to a cross-connect switches and column multiplexer 728. A row comparator 750 also receives a subset 718 of bits of the address input 720 and provides select lines to the cross-connect switches and column multiplexer 728. During write operations, the row address comparator compares the row addresses of SRAM cells being accessed and asserts a common write disturb enable signal if the SRAM cells being accessed through port A and port B belong to a common row. The demultiplexed lines of the column multiplexer 728 are the bit lines 714 and datapaths 715 for transmitting write disturb enable signals to the first, second, third and fourth criss-connect switches. For write operations, data is provided on lines 730 to a set of drivers 732, which provide outputs 734 for the column multiplexer 728 to drive the bit lines 714. For read operations, data from the SRAM cell array 710 on bit lines 714 passes through the column multiplexer 728 in the opposite direction, and via lines 736 to a sense amplifier 738. The sense amplifier provides output data on Data Out lines 740. In addition, read signals, port A and port B write enable signals are provided to a signal generator 742 to enable reading or writing globally therein. The structure and operation of column multiplexer 729, row and column decoders 716 and 724, driver 732 and sense amplifier 738 are not significant to the invention, so a reader will know a variety of designs that can be used for these functions. They are not further described herein.

In some embodiments, the transistors in the SRAM array 710 may be planar field effect transistors. In other embodiments, the transistors in the SRAM array 710 are Fin Field Effect Transistors (FinFETs) or nanowire transistors.

Figure 8A:
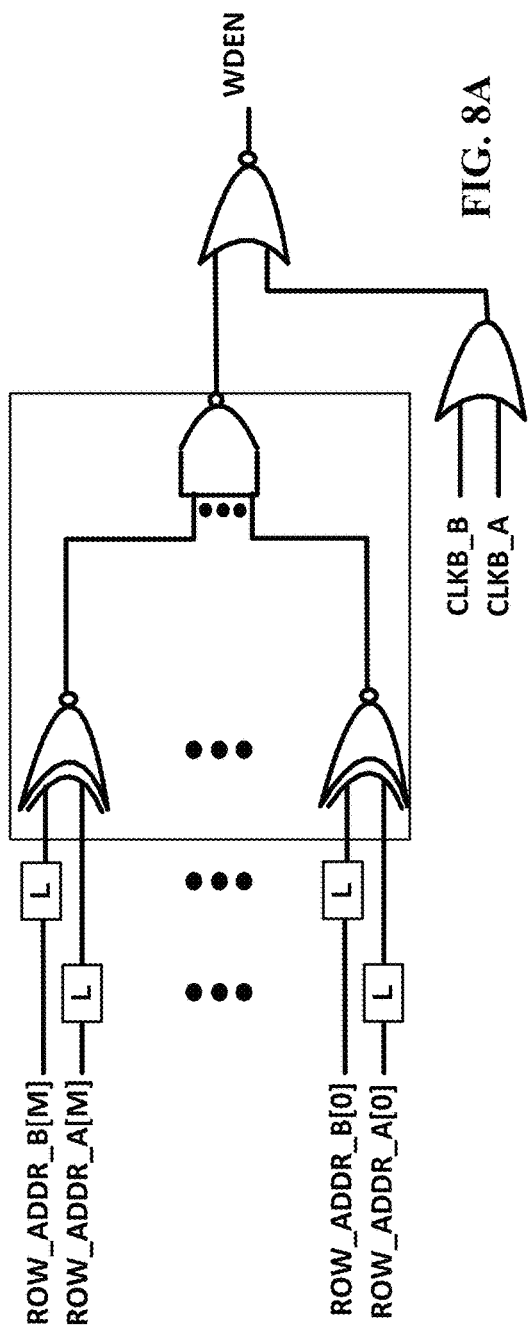
FIGS. 8A and 8B illustrate an example embodiment of a row address comparator.
Figure 8B:
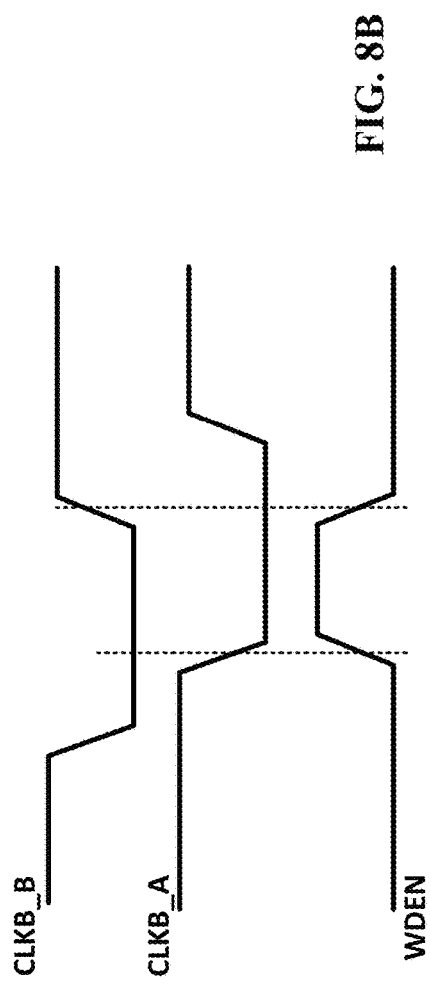

FIG. 8 illustrates an example embodiment of a row address comparator used for generating a common write disturb enable signals for a row of dual port SRAM cells. The row address comparator compares the row address in port A (ROW_ADDR_A[0:M]) and the row address in port B (ROW_ADDR_B[0:M]). The row address comparator asserts the write disturb enable signals (logic '1' in the embodiment of FIG. 8) when there is an overlap of the write/read operation in port A (CLKB_A) and port B (CLKB_B). The write disturb enable signals are asserted only for dual port access in the same row of SRAM cells.

The overall area penalty with the improved design described in FIG. 4 is approximately 1% for 32 Kb (256× 128; 4 bit-interleaving; single bank) dual port SRAM compared to the overhead reported in Y. Ishii et al., "A 28-nm dual port SRAM macro with active bit line equalizing circuitry against write disturb issue," in Symp. VLSI Circuits 2010 Dig. Tech. Papers, June 2010, pp. 99-100. Eight transistors are added to one column of SRAM cells resulting in an area overhead of 8/(256*8) equals $\frac{1}{256}$. Therefore, the total overall area comes around 1% of 256×128 dual port SRAM. Leakage overhead would also translate to be around 1% approximately. Moreover, as the memory size grows our proposed design area and leakage penalty would diminish.

Figure 9:
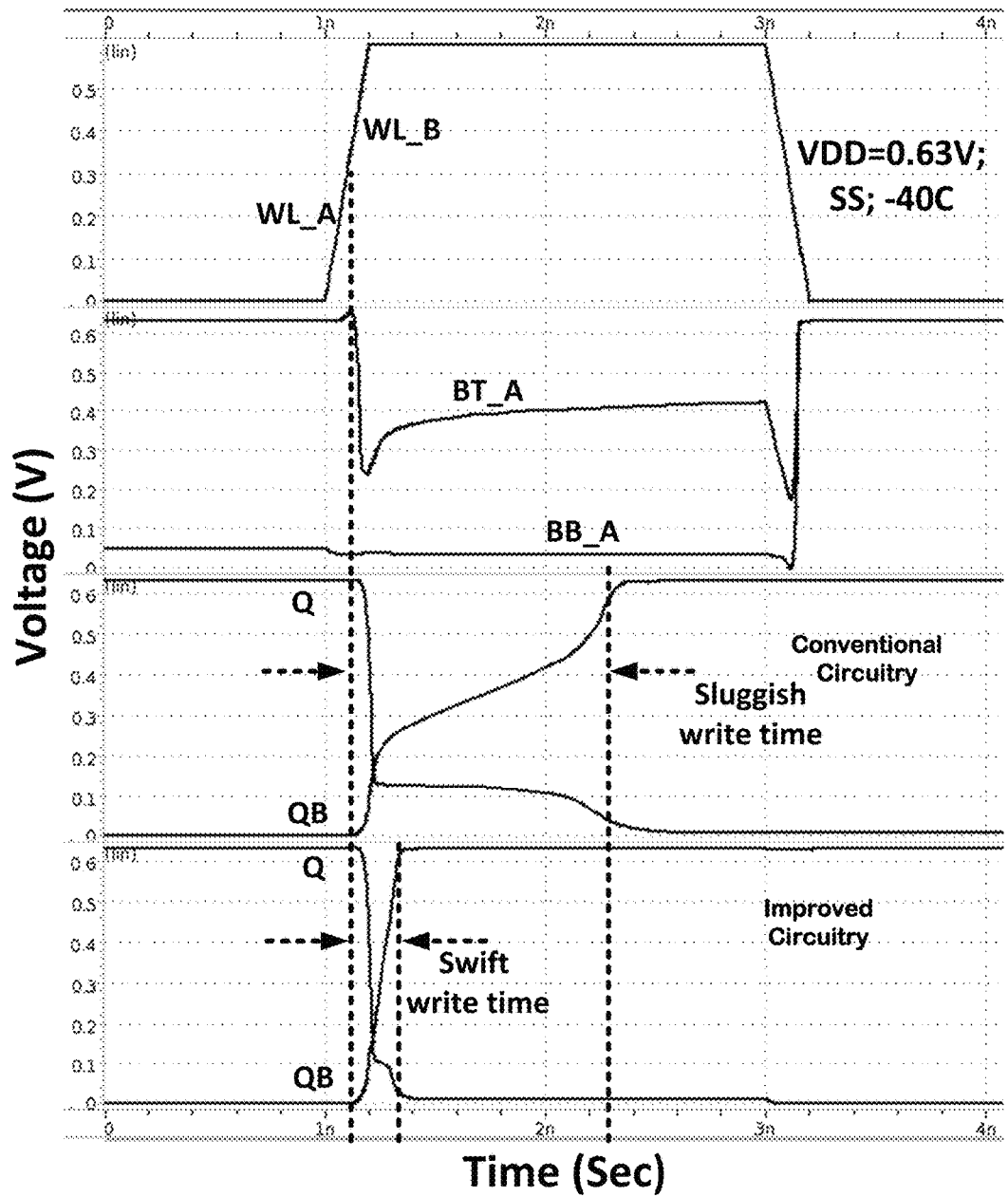
FIG. 9 illustrates simulated waveforms of write operations in a dual port SRAM cell.

FIG. 9 illustrates simulated waveforms during a write operation in port A and a pseudo read operation in port B in dual port SRAM cells with the conventional circuitry in FIG. 1 and the improved circuitry described in FIG. 4. Initially, the SRAM bit cells are holding a bit '1' at the Q node and a bit '0' at the QB node. In order to write Q='0', the data in the SRAM cells needs to be flipped through a write operation. As used herein, the write time is defined as the maximum time required for the storage node Q to fall to 10% $V_{DD}$ and the storage node QB to rise to 90% $V_{DD}$. A write operation in the port A is writing bit '0' in the Q node. For the conventional circuitry, the write time is extended due to write disturbances. For the improved design described herein, using N-channel transistors with nfin=4 as data transmission switches and cross-connect switches, a swifter write time is possible due to mitigation of write disturbances.

Figure 10A:
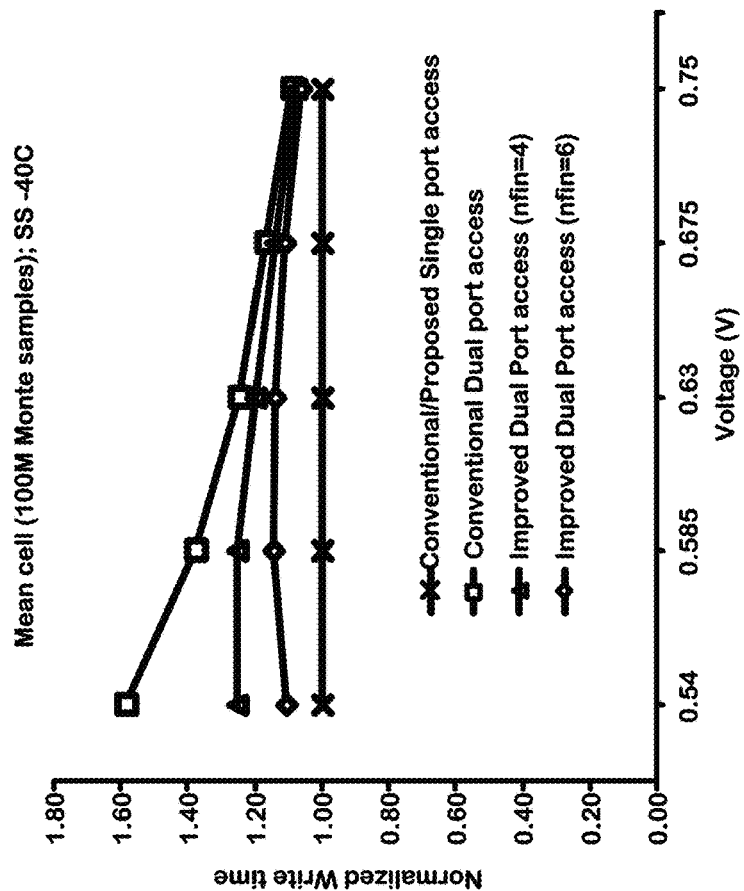
FIGS. 10A and 10B depict worst case write times and normalized mean write times in a dual port SRAM cell.

FIG. 10A depicts the worst case write time during a write operation in port A and a pseudo read operation in port B in a worst 6σ dual port SRAM cells with the conventional circuitry in FIG. 1 and the improved circuitry described herein in FIG. 4. The worst 6σ dual port SRAM cell is operating at 0.63V and −40° C. The worst case process corner SS (Slow NMOS Slow PMOS) for the SRAM cell is determined by running 100M Monte Carlo simulations using Synopsys HSPICE Simulator.

Figure 10B:
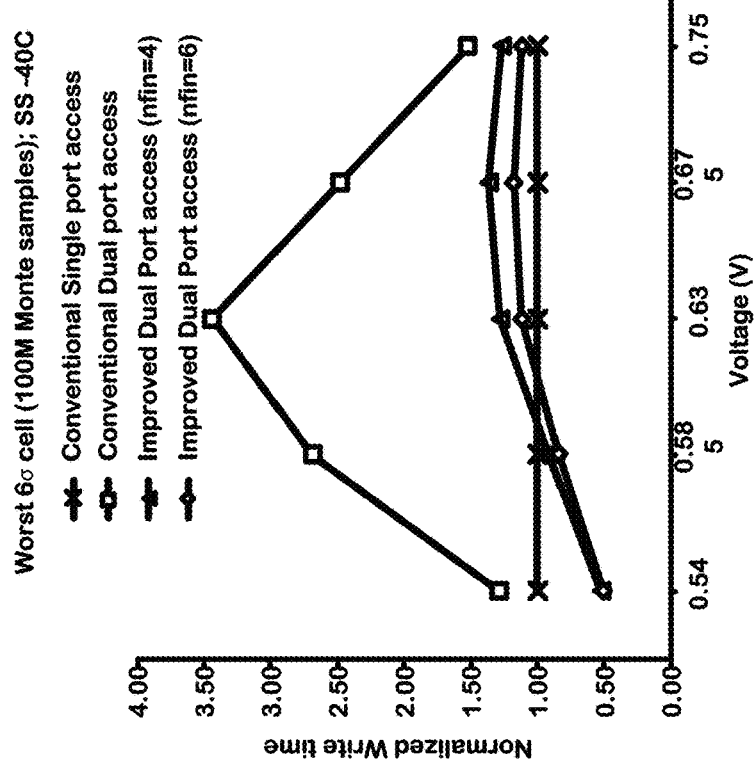

FIG. 10B illustrates the worst 6σ dual port SRAM cell's normalized write time with single port access and dual port access as a function of different operating voltages {0.54, 0.585, 0.63, 0.675, 0.75} in volts (V) for the conventional in FIG. 1 and the improved circuitry in FIG. 4 (nfin={4, 6}). The worst process corner SS and temperature of −40° C. are chosen. The improved circuitry with nfin=4 (nfin=6) achieves improvement of 2.16× (2.3×) at 0.63V compared to conventional circuitry during write operations with dual port access. Significant improvements are also seen at low voltages of 0.585V and 0.54V. The normalized write time is estimated by averaging the write time of 100 million monte samples.

EDA System/Workflow Explanation

Figure 11:
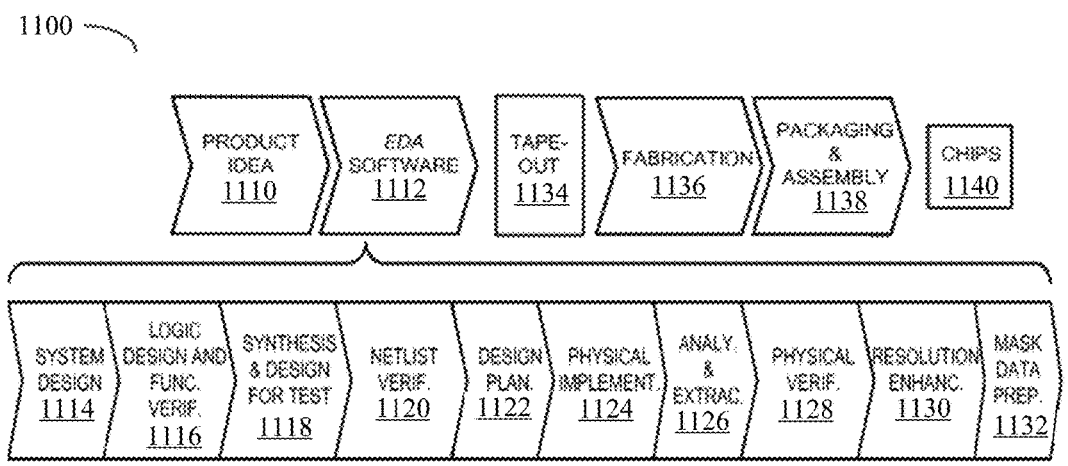
FIG. 11 depicts a flowchart of various operations in the design and fabrication of an integrated circuit in accordance with an embodiment of the present disclosure.

FIG. 11 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 1110 with information supplied by a designer, information which is transformed during a process to create an item of manufacture (referred to herein as a design or device) that uses an EDA software tool 1112, which may also be signified herein as EDA software, as a design tool, or a verification tool. When the design is finalized, it can be taped-out 1134, which typically is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed, which result in the finished integrated circuit 1140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 1112 includes processes 1114-1132, which are described below. This design flow description is for illustration purposes only and is not meant to limit the present disclosure. For example, an actual integrated circuit design may require a designer to perform the design operations in a different sequence than the sequence described herein.

During system design 1114, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 1116, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 1118, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 1120, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 1122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 1124, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 1126, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 1128, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 1130, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 1132, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 1112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

General Computer Explanation

FIGS. 12A, 12B and 12C are simplified block diagrams of a computer system suitable for use with embodiments of the technology, as well as circuit design and circuit embodiments of the technology.

In FIG. 12A, computer system 1210 typically includes at least one computer or processor 1214 which communicates with a number of peripheral devices via bus subsystem 1212. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 1224, comprising a memory subsystem 1226 and a file storage subsystem 1228, user interface input devices 1222, user interface output devices 1220, and a network interface subsystem 1216. The input and output devices allow user interaction with computer system 1210.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 1210 depicted in FIG. 12A is intended only as one example for purposes of illustrating the preferred embodiments. Many other configurations of computer system 1210 are possible having more or less components than the computer system depicted in FIG. 12A.

Network interface subsystem 1216 provides an interface to outside networks, including an interface to communication network 1218, and is coupled via communication network 1218 to corresponding interface devices in other computer systems or machines. Communication network 1218 may comprise many interconnected computer systems, machines and communication links. These communication links may be wireline links, optical links, wireless links, or any other devices for communication of information. Communication network 1218 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1222 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 1210 or onto communication network 1218. User interface input devices typically allow a user to select objects, icons, text and the like that appear on some types of user interface output devices, for example, a display subsystem.

User interface output devices 1220 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 1210 to the user or to another machine or computer system.

Memory subsystem 1226 typically includes a number of memories including a main random-access memory (RAM) 1230 (or other volatile storage device) for storage of instructions and data during program execution and a read only memory (ROM) 1232 in which fixed instructions are stored. File storage subsystem 1228 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1228.

Bus subsystem 1212 provides a device for letting the various components and subsystems of computer system 1210 communicate with each other as intended. Although bus subsystem 1212 is shown schematically as a single bus, alternative embodiments of the bus subsystem may use multiple busses. For example, RAM-based main memory can communicate directly with file storage systems using Direct Memory Access (DMA) systems.

FIG. 12B depicts a memory 1240 such as a non-transitory, computer readable data and information storage medium associated with file storage subsystem 1228, and/or with network interface subsystem 1216, and can include a data structure specifying a circuit design. The memory 1240 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 12C signifies an integrated circuit 1290 created with the described technology that includes one or more cells selected, for example, from a cell library.

Emulation Environment Explanation

Figure 13:
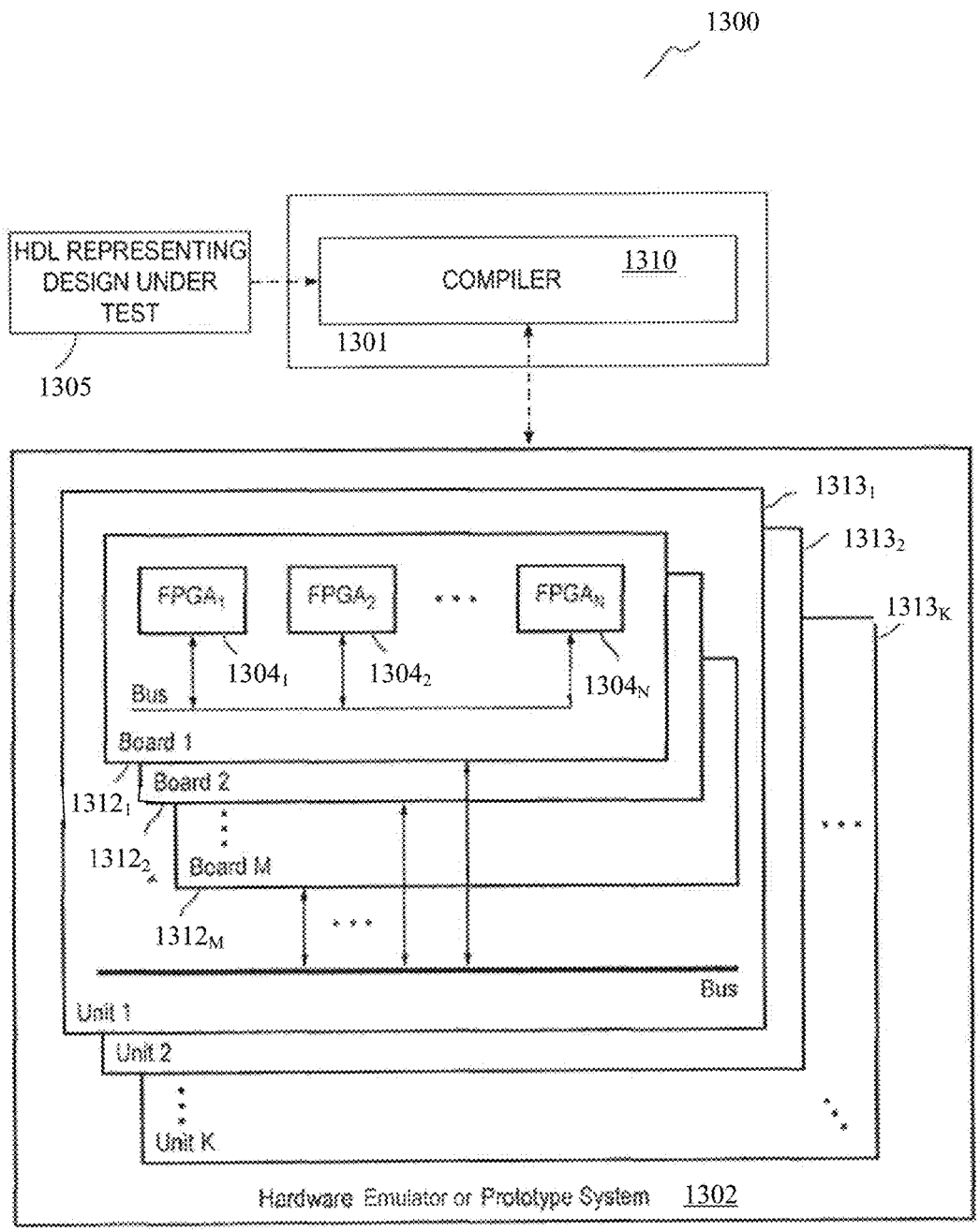
FIG. 13 depicts a block diagram of an emulation system.

An EDA software system, such as element 1112 depicted in FIG. 11 typically includes an emulation system 1116 to verify the functionality of the circuit design. FIG. 13 depicts a typical emulation system which includes a host computer system 1301 (often part of an EDA system) and an emulator system 1302 (typically a set of programmable devices such as Field Programmable Gate Arrays (FPGAs)). The host system generates data and information, typically using a compiler 1310, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 1301 comprises one or more processors. In the embodiment where the host system is comprised of multiple processors, the functions described herein as being performed by the host system may be distributed among the multiple processors.

The host system 1301 typically includes a compiler 1310 that processes code written in a hardware description language that represents a DUT, producing data (typically binary) and information that is used to configure the emulation system 1302 to emulate the DUT. The compiler 1310 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1304_1$ to $1304_N$ in FIG. 13. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1304_1$-$1304_N$ may be placed into one or more hardware boards $1312_1$ through $1312_m$. Many of such boards may be placed into a hardware unit, e.g. $1314_1$. The boards within a unit may be connected using the backplane of the unit or any other types of connections. In addition, multiple hardware units (e.g., $1314_1$ through $1314_K$) may be connected to each other by cables or any other means to form a multi-unit system. In general, the hardware emulation or prototype system 1302 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 1301 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1310 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Semantic Support

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract' } how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosto signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A static random access memory (SRAM) device, the SRAM device comprising a plurality of dual-port SRAM cells arranged in rows and columns, each SRAM cell comprising:
   a pair of cross-coupled inverters having a first data port coupled to a first word line, a first bit line, and a first bit-complement line, and further having a second data port coupled to a second word line, a second bit line, and a second bit-complement line,
   wherein the first bit line is connected to a first data terminal through a first data transmission switch responsive to a first port write signal, and to a second data terminal through, in series, a second data transmission switch responsive to a second port write signal and a first cross-connect switch responsive to a write disturb enable signal, wherein the second bit line is connected to the second data terminal through a third data transmission switch responsive to the second port write signal, and to the first data terminal through, in series, a fourth data transmission switch responsive to the first port write signal and a second cross-connect switch responsive to the write disturb enable signal, wherein the first bit-complement line is connected to a first data-complement terminal through a fifth data transmission switch responsive to the first port write signal, and to a second data-complement terminal through, in series, a sixth data transmission switch responsive to the second port write signal and a third cross-connect switch responsive to the write disturb enable signal, and wherein the second bit-complement line is connected to the second data-complement terminal through a seventh data transmission switch responsive to the second port write signal, and to the first data-complement terminal through, in series, an eighth data transmission switch responsive to the first port write signal and a fourth cross-connect switch responsive to the write disturb enable signal.

2. The SRAM device of claim 1, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch are N-channel transistors.

3. The SRAM device of claim 1, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch are P-channel transistors.

4. The SRAM device of claim 1, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch are transmission gates.

5. The SRAM device of claim 1, wherein the first cross-connect switches, the second cross-connect switches, the third cross-connect switches and the fourth cross-connect switches in a row of SRAM cells are all responsive to a common write disturb enable signal.

6. The SRAM device of claim 5 further comprising a row address comparator, the row address comparator comparing row addresses of SRAM cells being accessed and asserting the common write disturb enable signal in response to detection that two SRAM cells being accessed belong to a common row.

7. A method for reducing write disturbance while writing data into a first SRAM cell in a row of SRAM cells, each SRAM cell in the row of SRAM cells comprising a pair of cross-coupled inverters having a first data port coupled to a common first word line shared by SRAM cells in the row of SRAM cells, a first bit line, and a first bit-complement line and further having a second data port coupled to a common second word line shared by SRAM cells in the row of SRAM cells, a second bit line, and a second bit-complement line, the first bit line being connected to a first data terminal through a first data transmission switch responsive to a first port write signal, and to a second data terminal through, in series, a second data transmission switch responsive to a second port write signal and a first cross-connect switch responsive to a write disturb enable signal, the second bit line being connected to the second data terminal through a third data transmission switch responsive to the second port write signal, and to the first data terminal through, in series, a fourth data transmission switch responsive to the first port write signal and a second cross-connect switch responsive to the write disturb enable signal, the first bit-complement line being connected to a first data-complement terminal through a fifth data transmission switch responsive to the first port write signal, and to a second data-complement terminal through, in series, a sixth data transmission switch responsive to the second port write signal and a third cross-connect switch responsive to the write disturb enable signal, and the second bit-complement line being connected to the second data-complement terminal through a seventh data transmission switch responsive to the second port write signal, and to the first data-complement terminal through, in series, an eighth data transmission switch responsive to the first port write signal and a fourth cross-connect switch responsive to the write disturb enable signal, the method comprising, in a mutually time-overlapped manner:

applying a high voltage to the common first word line;

loading data to be written into the first SRAM cell onto the first data terminal;

asserting a first port write signal to the first data transmission switch, the fourth data transmission switch, the fifth data transmission switch and the eighth data transmission switch of the first SRAM cell; and asserting a write disturb enable signal to the first cross-connect switch, the second cross-connect switch, the third cross-connect switch and the fourth cross-connect switch of the first SRAM cell.

8. The method of claim 7, further comprising loading a complement of the data to be written in the first SRAM cell onto the first data-complement terminal of the first SRAM cell.

9. The method of claim 7, further comprising writing data in a second SRAM cell in the row of SRAM cells by applying a high voltage to the common second word line, loading data to be written in the second SRAM cell onto the second data terminal, asserting the second port write signal to the second data transmission switch, the third data transmission switch, the sixth data transmission switch and the seventh data transmission switch of the second SRAM cell, and asserting the write disturb enable signal to the first cross-connect switch, the second cross-connect switch, the third cross-connect switch and the fourth cross-connect switch of the second SRAM cell.

10. The method of claim 9, wherein first cross-connect switches, second cross-connect switches, third cross-connect switches and fourth cross-connect switches in the row of SRAM cells are responsive to a common write disturb enable signal.

11. The method of claim 10, wherein the common write disturb enable signal is asserted in response to detection that a second SRAM cell in the row of SRAM cells is being accessed while data is to be written into the first SRAM cell.

12. The method of claim 7, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of the first SRAM cell are N-channel transistors.

13. The method of claim 7, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of the first SRAM cell are P-channel transistors.

14. The method of claim 7, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of the first SRAM cell are transmission gates.

15. A method for reducing write disturbance while writing data into a first SRAM cell in a first row of SRAM cells and accessing a second SRAM cell in a the first row of SRAM cells, each SRAM cell in the first row of SRAM cells comprising a pair of cross-coupled inverters having a first data port coupled to a common first word line shared by SRAM cells in the first row of SRAM cells, a first bit line, and a first bit-complement line and further having a second data port coupled to a common second word line shared by SRAM cells in the first row of SRAM cells, a second bit line, and a second bit-complement line, the first bit line being connected to a first data terminal through a first data transmission switch responsive to a first port write signal, and to a second data terminal through, in series, a second data transmission switch responsive to a second port write signal and a first cross-connect switch responsive to a write disturb enable signal, the second bit line being connected to the second data terminal through a third data transmission switch responsive to the second port write signal, and to the first data terminal through, in series, a fourth data transmission switch responsive to the first port write signal and a second cross-connect switch responsive to the write disturb enable signal, the first bit-complement line being connected to a first data-complement terminal through a fifth data transmission switch responsive to the first port write signal, and to a second data-complement terminal through, in series, a sixth data transmission switch responsive to the second port write signal and a third cross-connect switch responsive to the write disturb enable signal, and the second bit-complement line being connected to the second data-complement terminal through a seventh data transmission switch responsive to the second port write signal, and to the first data-complement terminal through, in series, an eighth data transmission switch responsive to the first port write signal and a fourth cross-connect switch responsive to the write disturb enable signal, the method comprising, in a mutually time-overlapped manner:

applying a high voltage to the common first word line;
applying a high voltage to the common second word line;
loading data to be written into the first SRAM cell onto the first data terminal;
asserting a first port write signal to the first data transmission switch, the fourth data transmission switch, the fifth data transmission switch and the eighth data transmission switch of the first SRAM cell; and
asserting a common write disturb enable signal to the first cross-connect switch, the second cross-connect switch, the third cross-connect switch and the fourth cross-connect switch of the first SRAM cell and first cross-connect switch, the second cross-connect switch, the third cross-connect switch and the fourth cross-connect switch of the second SRAM cell.

16. The method of claim 15, further comprising loading a complement of the data to be written in the first SRAM cell onto the first data-complement terminal.

17. The method of claim 16, further comprising loading a complement of to be written in the second SRAM cell in the second data-complement terminal.

18. The method of claim 15, wherein the common write disturb enable signal is asserted in response to detection the second SRAM cell in the row of SRAM cells is being accessed while data is to be written into the first SRAM cell.

19. The method of claim 15, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of the SRAM cells in the row of SRAM cells are N-channel transistors.

20. The method of claim 15, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of the SRAM cells in the row of SRAM cells are P-channel transistors.

21. The method of claim 15, wherein the first data transmission switch, the second data transmission switch, the third data transmission switch, the fourth data transmission switch, the fifth data transmission switch, the sixth data transmission switch, the seventh data transmission switch, the eight data transmission switch, the first cross-connect switch, the second cross-connect switch, the third cross-connect switch and the fourth cross-connect switch of all the SRAM cells in the row of SRAM cells are transmission gates.

22. A method for reducing write disturbance while writing data into a first SRAM cell in a first row of SRAM cells while accessing a second SRAM cell in the first row of SRAM cells,
- each SRAM cell in the first row of SRAM cells comprising a pair of cross-coupled inverters having a first data port enabled by a common first word line shared by the SRAM cells in the first row of SRAM cells, and further having a second data port enabled by a common second word line shared by the SRAM cells in the first row of SRAM cells, each of the data ports including a bit line and a bit-complement line, the method comprising, in a mutually time-overlapped manner:
- applying data to be written into the first SRAM cell at the first data port of the first SRAM cell;
- in response to detection that the second SRAM cell is being accessed while data is to be written into the first SRAM cell, applying the data to be written into the first SRAM cell also at the second data port of the first SRAM cell; and
- enabling the first and second data ports of the SRAM cells in the first row.

23. The method of claim 22, wherein the access of the second SRAM cell is a read access.

24. The method of claim 22, wherein the access of the second SRAM cell is a write access, the method further comprising applying second data to be written into the second SRAM cell at the first and second data ports of the second SRAM cell, in a time-overlapped manner with the step of enabling the first and second data ports of the SRAM cells in the first row.

* * * * *